(12) United States Patent
Fujita et al.

(10) Patent No.: US 8,369,129 B2
(45) Date of Patent: Feb. 5, 2013

(54) SEMICONDUCTOR MEMORY DEVICE WITH VARIABLE RESISTANCE ELEMENT

(75) Inventors: Katsuyuki Fujita, Yokohama (JP); Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 12/818,028

(22) Filed: Jun. 17, 2010

(65) Prior Publication Data
US 2010/0321980 A1 Dec. 23, 2010

(30) Foreign Application Priority Data

Jun. 18, 2009 (JP) ................................ 2009-145469

(51) Int. Cl.
*G11C 11/00* (2006.01)
(52) U.S. Cl. ........ 365/148; 365/158; 365/173; 365/171; 365/163
(58) Field of Classification Search .................. 365/148, 365/158, 161, 162, 163, 171, 173, 172, 174, 365/189.09, 207, 100, 112, 160, 157, 338, 365/159, 71, 113, 130
See application file for complete search history.

(56) References Cited

U.S. PATENT DOCUMENTS

| | | | |
|---|---|---|---|
| 6,445,612 B1 | 9/2002 | Naji | |
| 6,567,330 B2 | 5/2003 | Fujita et al. | |
| 6,862,228 B2 | 3/2005 | Hung et al. | |
| 7,457,150 B2 * | 11/2008 | Tsuchida et al. | 365/158 |
| 7,755,923 B2 * | 7/2010 | Liu et al. | 365/148 |
| 7,952,916 B2 * | 5/2011 | Maeda et al. | 365/158 |

FOREIGN PATENT DOCUMENTS

| | | |
|---|---|---|
| JP | 2005-501370 | 1/2005 |
| WO | WO 03/019567 A1 | 3/2003 |

OTHER PUBLICATIONS

Background Art Information.

* cited by examiner

*Primary Examiner* — Kretelia Graham
(74) *Attorney, Agent, or Firm* — Knobbe, Martens, Olson & Bear, LLP

(57) ABSTRACT

According to one embodiment, a semiconductor memory device includes a variable resistance element configured to store data "0" and data "1" in accordance with a change in resistance value, a current generator configured to generate a reference current for determining data of the variable resistance element, and having an admittance middle between an admittance of a variable resistance element storing data "0" and an admittance of a variable resistance element storing data "1", and a sense amplifier includes a first input terminal connected to the variable resistance element and a second input terminal connected to the current generator, and configured to compare currents of the first input terminal and the second input terminal.

13 Claims, 7 Drawing Sheets

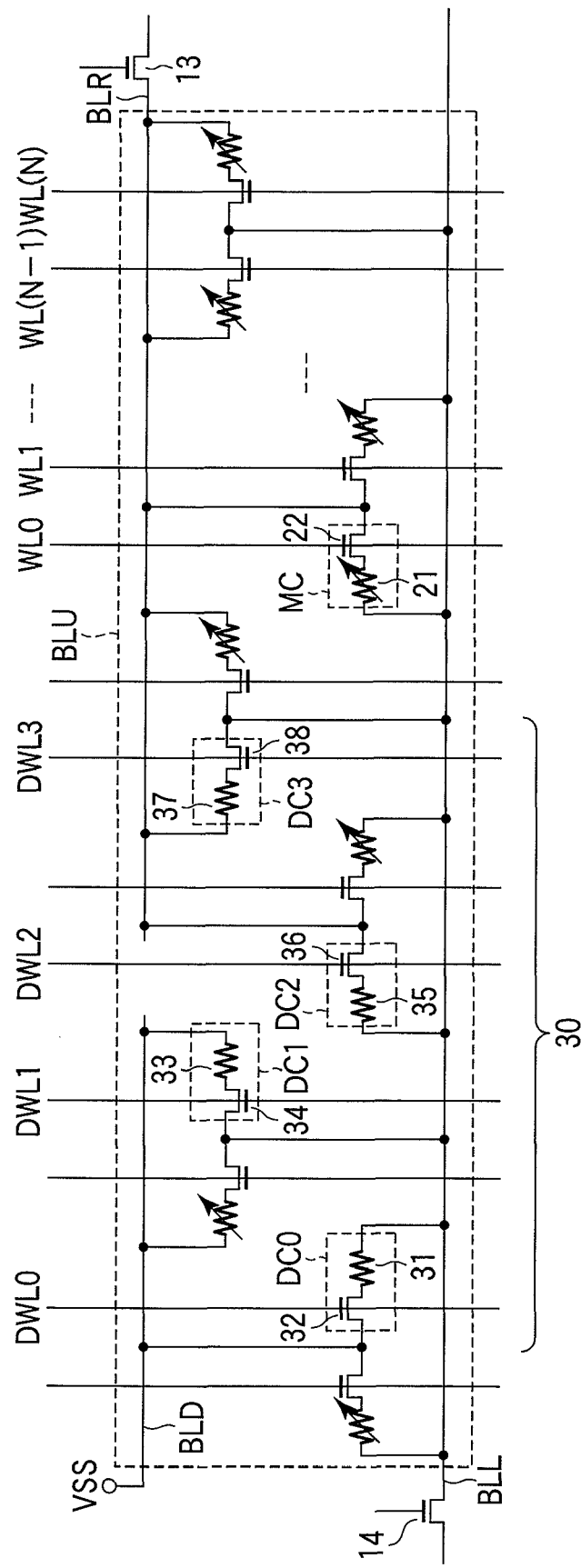
F I G. 2

Parallel→Rmin

Antiparallel→Rmax

SEMICONDUCTOR MEMORY DEVICE WITH VARIABLE RESISTANCE ELEMENT

CROSS-REFERENCE TO RELATED APPLICATIONS

This application is based upon and claims the benefit of priority from Japanese Patent Application No. 2009-145469, filed Jun. 18, 2009; the entire contents of which are incorporated herein by reference.

FIELD

Embodiments described herein relate generally to a semiconductor memory device.

BACKGROUND

Recently, a semiconductor memory such as a magnetic random access memory (MRAM) using a variable resistance element as a memory element is attracting attention and being developed. The MRAM uses, as a memory element, a magnetic tunnel junction (MTJ) element using the magnetoresistive effect by which the resistance value changes in accordance with the magnetization direction. In particular, a large resistance change is obtained by a tunneling magnetoresistive (TMR) element using the TMR effect.

The TMR element has a structure in which two ferromagnetic layers sandwich a nonmagnetic layer (insulating layer). While the magnetization direction in one ferromagnetic layer (pinned layer) is fixed, the magnetization direction in the other ferromagnetic layer (free layer) is not fixed; the magnetic direction in the free layer is parallel or antiparallel to that in the pinned layer. The TMR effect is a phenomenon in which the resistance of the TMR element changes depending on the relative relationship (parallel/antiparallel) between the two magnetization directions. More specifically, a current readily flows through the insulating layer (the resistance decreases) when the magnetization direction in the free layer is parallel to that in the pinned layer, and hardly flows (the resistance increases) when the former is antiparallel to the latter. A memory element from which data written in the TMR element can be read in accordance with the resistance can be formed by making the relative relationship between the two magnetization directions correspond to "0" or "1".

The TMR element has a resistance value Rmin or Rmax (Rmax>Rmin) in accordance with whether the magnetization directions in the free layer and pinned layer are parallel or antiparallel. In a read operation of the MRAM, it is necessary to supply a read current or apply a read voltage to a memory cell as a read target, and read data by comparing the change in voltage or current corresponding to the resistance value of the TMR element with a reference signal. The reference signal is formed from an external circuit or from a reference cell in which data "0" or "1" is prewritten. However, the method of forming the reference signal from an external circuit has the problem that the method requires extra space and extra power consumption, and it is necessary to reproduce characteristics that follow the temperature characteristics of the TMR element.

Accordingly, even when reading data from the MRAM by using the reference signal, it is desirable to generate the reference signal by using the TMR element. As a method of generating this reference signal, a method using middle resistance Rmid=(Rmax+Rmin)/2 of the TMR element has been disclosed (Jpn. PCT National Publication No. 2005-501370). In this method, however, the reference current is not middle between a current flowing through the resistance value Rmin and a current flowing through the resistance value Rmax, and as a consequence the sense margin decreases.

Also, in the MRAM using the spin transfer method, as a current is supplied to the TMR element in a read operation in the same manner as in a write operation, a so-called read disturbance by which a write error occurs during data read is highly likely to occur. Especially in the method of generating the reference current from a reference cell in a read operation, the reference cell is accessed more frequently than a cell as a read target. This increases the probability that the reference cell suffers the read disturbance.

BRIEF DESCRIPTION OF THE DRAWINGS

FIG. 2 is a circuit diagram showing the arrangement of a memory unit BLU;

DETAILED DESCRIPTION

Figure 1:
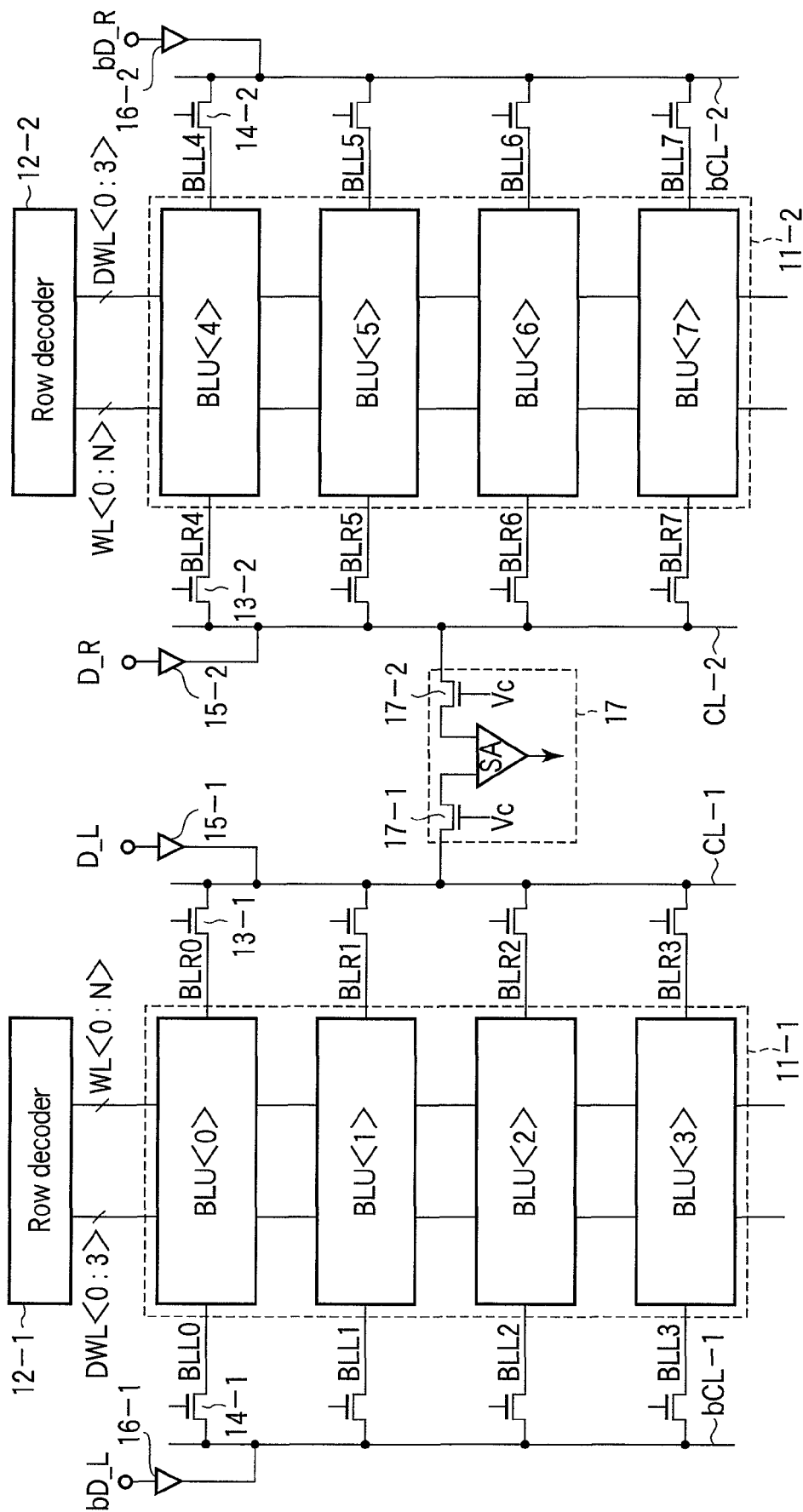
FIG. 1 is a block diagram showing the arrangement of an MRAM according to the first embodiment.

In general, according to one embodiment, there is provided a semiconductor memory device comprising: a variable resistance element configured to store data "0" and data "1" in accordance with a change in resistance value; a current generator configured to generate a reference current for determining data of the variable resistance element, and having an admittance middle between an admittance of a variable resistance element storing data "0" and an admittance of a variable resistance element storing data "1"; and a sense amplifier comprising a first input terminal connected to the variable resistance element and a second input terminal connected to the current generator, and configured to compare currents of the first input terminal and the second input terminal.

The embodiments will be described hereinafter with reference to the accompanying drawings. In the description which follows, the same or functionally equivalent elements are denoted by the same reference numerals, to thereby simplify the description.

(First Embodiment)

As a resistance-change memory, it is possible to use various types of memories such as a magnetic random access memory (MRAM), resistive random access memory (ReRAM), and phase-change random access memory (PCRAM). This embodiment will be explained by taking the MRAM as an example of the resistance-change memory. The MRAM includes an MTJ element using the magnetoresistive effect as a memory cell, and stores information in accordance with the magnetization arrangement of this MTJ element.

FIG. 1 is a block diagram showing the arrangement of the MRAM according to the first embodiment. The MRAM of this embodiment is a so-called spin transfer type MRAM in which a write current is directly supplied to the MTJ element, and information is recorded in the MTJ element in accordance with the direction of the write current.

The MRAM includes two memory cell arrays 11-1 and 11-2. Each memory cell array 11 includes a plurality of memory units (BL units) BLU formed for each bit line. For the sake of simplicity, FIG. 1 shows an arrangement in which the memory cell array 11-1 includes four memory units BLU<0:3>, and the memory cell array 11-2 includes four memory units BLU<4:7>. In practice, however, more memory cell units BLU are arranged. Each memory unit BLU includes a plurality of memory cells.

Each memory cell array 11 includes a plurality of bit lines BLR and a plurality of bit lines BLL running in the column direction. The number of bit lines BLR and the number of bit lines BLL are the same as the number of memory units BLU. A pair of the bit lines BLR and BLL are formed for each memory unit BLU.

Each memory cell array 11 includes (N+1) word lines WL<0:N> and four dummy word lines DWL<0:3> running in the row direction. N is 0 or a natural number of 1 or more.

A row decoder 12 is connected to the word lines WL<0:N> and dummy word lines DWL<0:3>. Reference numeral "12-1" denotes a row decoder for the memory cell array 11-1; and "12-2", a row decoder for the memory cell array 11-2. In a write operation, read operation, and erase operation, the row decoder 12 performs a selecting process on the word lines WL<0:N> and dummy word lines DWL<0:3> based on an externally supplied address.

Bit lines BLR0 to BRL3 formed in the memory units BLU<0:3> are connected to a common line CL-1 via column gates 13-1. Bit lines BLL0 to BLL3 formed in the memory units BLU<0:3> are connected to a common line bCL-1 via column gates 14-1.

Bit lines BLR4 to BRL7 formed in the memory units BLU<4:7> are connected to a common line CL-2 via column gates 13-2. Bit lines BLL4 to BLL7 formed in the memory units BLU<4:7> are connected to a common line bCL-2 via column gates 14-2.

Note that the column gates 13 and 14 are formed for each memory unit BLU. Each column gate is, e.g., an N-channel metal oxide semiconductor field effect transistor (MOSFET), and has a gate connected to a column decoder (not shown). When the column decoder turns on a column gate connected to a selected memory unit BLU, a write operation, read operation, or erase operation is executed for the selected memory unit BLU.

A sense amplifier circuit 17 is connected to the common lines CL-1 and CL-2. The sense amplifier circuit 17 includes two clamp transistors 17-1 and 17-2, and a sense amplifier SA. Each of the clamp transistors 17-1 and 17-2 is, e.g., an N-channel MOSFET. The clamp transistor 17-1 has a source connected to the common line CL-1, and a drain connected to the first input terminal of the sense amplifier SA. The clamp transistor 17-2 has a source connected to the common line CL-2, and a drain connected to the second input terminal of the sense amplifier SA. A clamp voltage Vc is applied to the gates of the clamp transistors 17-1 and 17-2. By controlling the clamp voltage Vc, the clamp transistors 17-1 and 17-2 respectively set the common lines CL-1 and CL-2 at desired voltages in a read operation.

In a read operation, the sense amplifier SA compares the currents of the first and second input terminals. More specifically, a read current corresponding to data of a memory cell as a read target is supplied to one input terminal of the sense amplifier SA, and a reference current is supplied to the other input terminal. The sense amplifier SA senses the data read from the memory cell as a read target by comparing the read current with the reference current.

The common line CL-1 is connected to the output of a driver (write circuit) 15-1. The input of the driver 15-1 is connected to a terminal D_L. The common line bCL-1 is connected to the output of a driver (write circuit) 16-1. The input of the driver 16-1 is connected to a terminal bD_L. In a write operation, the drivers 15-1 and 16-1 supply bi-directional write currents corresponding to data between the bit lines BLR and BLL.

Similarly, the common line CL-2 is connected to the output of a driver (write circuit) 15-2. The input of the driver 15-2 is connected to a terminal D_R. The common line bCL-2 is connected to the output of a driver (write circuit) 16-2. The input of the driver 16-2 is connected to a terminal bD_R. In a write operation, the drivers 15-2 and 16-2 supply bi-directional write currents corresponding to data between the bit lines BLR and BLL.

FIG. 2 is a circuit diagram showing the arrangement of one memory unit BLU. The memory unit BLU includes (N+1) memory cells MC corresponding to the (N+1) word lines WL<0:N>, and four dummy cells DC0 to DC3 corresponding to the four dummy word lines DWL<0:3>. The memory unit BLU further includes a third bit line BLD in addition to the two bit lines BLR and BLL. A ground voltage VSS is applied to the bit line BLD.

Each memory cell MC includes a magnetic tunnel junction (MTJ) element 21 as a variable resistance element, and a selection transistor 22. The selection transistor 22 is, e.g., an N-channel MOSFET. The MTJ element 21 has one terminal connected to the bit line BLL (or BLR), and the other terminal connected to one end of the current path of the selection transistor 22. The other end of the current path of the selection transistor 22 is connected to the bit line BLR (or BLL). The gate of the selection transistor 22 is connected to the word line WL.

In this embodiment, two memory cells in each of which one terminal of the MTJ element 21 is connected to the bit line BLL and two memory cells in each of which one terminal of the MTJ element 21 is connected to the bit line BLR are alternately arranged along the column direction. This implements a memory cell having a size of $8F^2$. "F" is a minimum feature size resulting from the manufacturing process.

Figure 3:
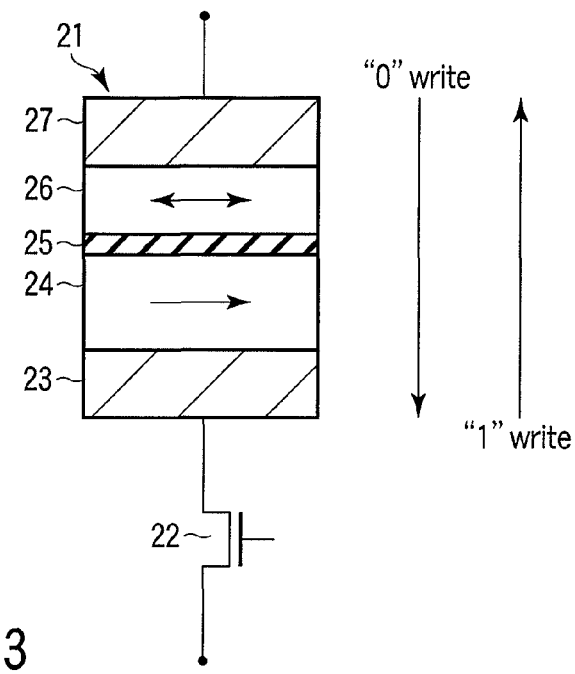
FIG. 3 is a schematic view showing the arrangement of an MTJ element 21.

FIG. 3 is a schematic view showing the arrangement of the MTJ element 21. The MTJ element 21 is formed by sequentially stacking a lower electrode 23, a fixed layer 24, an interlayer 25, a recording layer (also called a free layer) 26, and an upper electrode 27. Note that the stacking order of the layers forming the MTJ element 21 may also be reversed.

The fixed layer 24 is made of a ferromagnetic material and has a fixed magnetization direction. The magnetization direction in the fixed layer 24 can be fixed by, e.g., forming an antiferromagnetic layer (not shown) adjacent to the fixed layer 24. The recording layer 26 is made of a ferromagnetic material and has a variable magnetization direction. The interlayer 25 is made of a nonmagnetic material. More specifically, it is possible to use, e.g., a nonmagnetic metal, nonmagnetic semiconductor, or insulator. The interlayer 25 is called a tunnel barrier layer when using an insulator, and called a spacer layer when using a metal.

The direction of easy magnetization in the fixed layer 24 and recording layer 26 can be perpendicular to the film surfaces (perpendicular magnetization), or parallel to the film surfaces (in-plane magnetization). A perpendicular magnetization type element is suitable for micropatterning because the element shape need not be controlled to determine the magnetization direction unlike in an in-plane magnetization type element.

Data is written in the MTJ element 21 by the spin transfer method by which a write current is directly supplied to the MTJ element 21. The MTJ element 21 is set in a low-resistance state or high-resistance state by changing the direction of the write current in accordance with data.

Figure 4A:
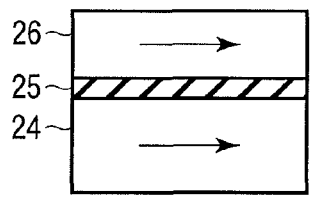
FIGS. 4A and 4B are views respectively showing the low-resistance state and high-resistance state of the MTJ element 21.
Figure 4B:
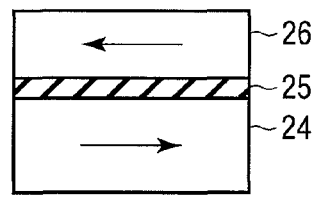

FIGS. 4A and 4B respectively illustrate the low-resistance state and high-resistance state of the MTJ element 21. In a parallel state (the low-resistance state) in which the magnetization arrangements in the fixed layer 24 and recording layer 26 are parallel, the resistance value of the MTJ element 21 is minimum. This state is defined as data "0". The resistance value of the MTJ element 21 in the parallel state is represented by "Rmin".

On the other hand, in an antiparallel state (the high-resistance state) in which the magnetization arrangements in the fixed layer 24 and recording layer 26 are antiparallel, the resistance value of the MTJ element 21 is maximum. This state is defined as data "1". The resistance value of the MTJ element 21 in the antiparallel state is represented by "Rmax".

When writing data "0" in the MTJ element 21, a write current is supplied downward in FIG. 3, i.e., from the recording layer 26 to the fixed layer 24. When writing data "1" in the MTJ element 21, a write current is supplied upward in FIG. 3, i.e., from the fixed layer 24 to the recording layer 26. Note that when the stacking positions of the fixed layer 24 and recording layer 26 are switched, the direction of a write current is reversed accordingly.

Data is read by supplying a uni-directional read current to the MTJ element 21. A value defined by "(Rmax−Rmin)/Rmin" is called a magnetoresistive ratio (MR ratio). Although the MR ratio changes in accordance with the materials and process conditions of the MTJ element 21, the MR ratio can take a value from about a few ten percent to about a few hundred percent. Data stored in the MTJ element 21 is read by sensing the magnitude of a read current caused by this MR ratio by the sense amplifier SA. In a read operation, a read current to be supplied to the MTJ element 21 is set to have a current value much smaller than that of a current that reverses the magnetization of the recording layer 26 by spin transfer.

Letting Vb be the bit line voltage of a read operation, a read current I0 flowing through an MTJ element having the resistance value Rmin and a read current I1 flowing through an MTJ element having the resistance value Rmax are respectively represented by $$I0=(1/R\text{min})*Vb$$

$$I1=(1/R\text{max})*Vb$$

where "*" is a multiplication sign.

Accordingly, by setting a reference current Iref middle between the read currents I0 and I1, the sense margin can be increased when determining the read currents I0 and I1. This makes it possible to reduce read errors. To generate the reference current Iref middle between the read currents I0 and I1, it is necessary to generate a middle admittance Ymid indicated by $$Y\text{mid}=(R\text{max}+R\text{min})/(2R\text{max}*R\text{min})$$

That is, an admittance Ymin of an MTJ element storing data "0" (an MTJ element having the resistance value Rmin) is 1/Rmin, and an admittance Ymax of an MTJ element storing data "1" (an MTJ element having the resistance value Rmax) is 1/Rmax. Therefore, the middle admittance Ymid described above is obtained by calculating Ymid=(Ymin+Ymax)/2.

Figure 5:
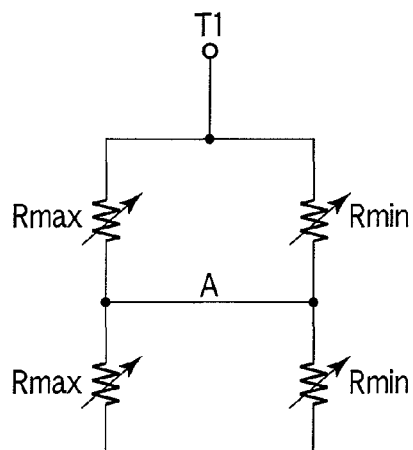
FIG. 5 is a circuit diagram for generating a middle admittance Ymid.

FIG. 5 is a circuit diagram for generating the middle admittance Ymid. Two resistors Rmax are connected in series between terminals T1 and T2. In addition, two resistors Rmin are connected in series between the terminals T1 and T2 so as to be parallel to the two resistors Rmax. Although nodes A are shortcircuited in the circuit diagram of FIG. 5, they need not always be shortcircuited.

The memory unit BLU includes a reference current generator 30 for generating a reference current to be used by the sense amplifier SA in a read operation. The reference current generator 30 includes four dummy cells DC0 to DC3. The dummy cells DC0 to DC3 form the middle admittance generator shown in FIG. 5. The dummy cells DC0 to DC3 each have the same structure as that of the memory cell MC.

As shown in FIG. 2, an MTJ element (resistance element) 31 included in the dummy cell DC0 has one terminal connected to the bit line BLL, and the other terminal connected to one end of the current path of a selection transistor 32. The other end of the current path of the selection transistor 32 is connected to the bit line BLD, and the gate of the selection transistor 32 is connected to a dummy word line DWL0. The MTJ element 31 is set at the resistance value Rmin.

An MTJ element (resistance element) 33 included in the dummy cell DC1 has one terminal connected to the bit line BLD, and the other terminal connected to one end of the current path of a selection transistor 34. The other end of the current path of the selection transistor 34 is connected to the bit line BLL, and the gate of the selection transistor 34 is connected to a dummy word line DWL1. The MTJ element 33 is set at the resistance value Rmax.

An MTJ element (resistance element) 35 included in the dummy cell DC2 has one terminal connected to the bit line BLL, and the other terminal connected to one end of the current path of a selection transistor 36. The other end of the current path of the selection transistor 36 is connected to the bit line BLR, and the gate of the selection transistor 36 is connected to a dummy word line DWL2. The MTJ element 35 is set at the resistance value Rmax.

An MTJ element (resistance element) 37 included in the dummy cell DC3 has one terminal connected to the bit line BLR, and the other terminal connected to one end of the current path of a selection transistor 38. The other end of the current path of the selection transistor 38 is connected to the bit line BLL, and the gate of the selection transistor 38 is connected to a dummy word line DWL3. The MTJ element 37 is set at the resistance value Rmin.

The dummy cells DC0 to DC3 having the connection relationships as described above form the middle admittance generator shown in FIG. 5. Accordingly, the dummy cells DC0 to DC3 can generate the reference current Iref middle between the read currents I0 and I1.

(Operation)

The operation of the MRAM configured as described above will be explained below. When a read process occurs for one of the memory cell arrays 11-1 and 11-2 in the MRAM of this embodiment, the other is used to generate the reference current Iref. The operation will be explained by taking the process of reading data from the memory unit BLU<0> included in the memory cell array 11-1 as an example.

First, the column decoder (not shown) turns on the column gate 13-1 connected to the bit line BLR0, thereby connecting the memory unit BLU<0> to the common line CL-1. The column gate 14-1 connected to the bit line BLL0 is turned off. Subsequently, a desired clamp voltage Vc is applied to the gate of the clamp transistor 17-1, and the clamp transistor 17-1 sets the bit line BLR0 at a desired read voltage Vb. In this state, the sense amplifier SA applies a power supply voltage VDD to the drain of the clamp transistor 17-1.

Also, the column decoder turns on the column gate 14-1 connected to the bit line BLL0, thereby connecting the memory unit BLU<0> to the common line bCL-1. The bit line BLL0 is grounded via the driver 16-1.

Finally, the row decoder 12-1 activates the word line WL connected to the memory cell MC as a read target. The series of operations described above supply a read current corresponding to the data to the memory cell MC as a read target.

On the other hand, a certain memory unit BLU, e.g., the memory unit BLU<4> included in the memory cell array 11-2 generates the reference current Iref. First, the column decoder (not shown) turns on the column gate 13-2 connected to the bit line BLR4, thereby connecting the memory unit BLU<4> to the common line CL-2. The column gate 14-2 connected to the bit line BLL4 is turned off. Subsequently, the desired clamp voltage Vc is applied to the gate of the clamp transistor 17-2, and the clamp transistor 17-2 sets the bit line BLR4 at the desired read voltage Vb. Then, the row decoder 12-2 activates all the dummy word lines DWL0 to DWL3 to turn on the selection transistors 32, 34, 36, and 38 included in the dummy cells DC0 to DC3.

Figure 6:
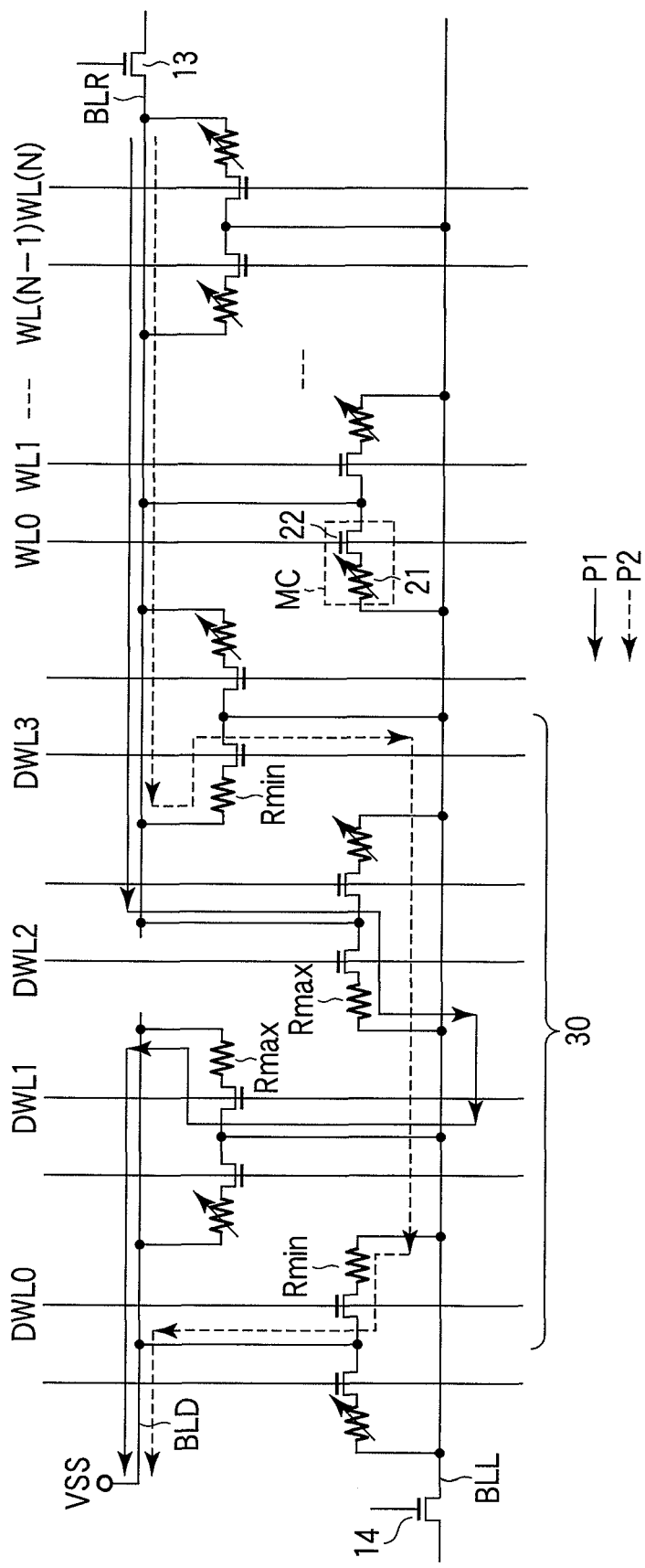
FIG. 6 is a circuit diagram showing the current paths of a reference current generator 30.

FIG. 6 is a circuit diagram showing the current paths of the reference current generator 30. A first current path P1 runs through the bit line BLR, the resistance element Rmax of the dummy cell DC2, the bit line BLL, the resistance element Rmax of the dummy cell DC1, and the bit line BLD. A second current path P2 runs through the bit line BLR, the resistance element Rmin of the dummy cell DC3, the bit line BLL, the resistance element Rmin of the dummy cell DC0, and the bit line BLD. That is, the reference current generator 30 forms the middle admittance circuit shown in FIG. 5 by the first current path P1 and second current path P2. In a read operation, therefore, the reference current generator 30 generates the reference current Iref middle between the read current I0 of a "0" cell and the read current I1 of a "1" cell.

The sense amplifier SA senses the data of the memory cell MC as a read target by comparing a read current flowing through the bit line BLR0 with the reference current Iref flowing through the bit line BLR4.

As described previously, the dummy cells DC0 to DC3 of this embodiment have the same structure as that of the memory cell MC, i.e., the dummy cells DC0 to DC3 have the structure shown in FIG. 3. When the current paths shown in FIG. 6 are implemented, a current in the same direction as that of a "0" write current flows through the MTJ elements 31 and 37 having the resistance value Rmin, i.e., the MTJ elements 31 and 37 storing data "0". Also, a current in the same direction as that of a "1" write current flows through the MTJ elements 33 and 35 having the resistance value Rmax, i.e., the MTJ elements 33 and 35 storing data "1".

In the reference current generator 30 of this embodiment, therefore, it is possible to prevent the magnetization arrangements in the MTJ elements 31, 33, 35, and 37 included in the dummy cells DC0 to DC3 from reversing owing to the influence of a read disturbance during a read operation.

Next, a write operation of the MRAM will be explained. The drivers 15-1 and 16-1 write data in the memory cell array 11-1. The drivers 15-2 and 16-2 write data in the memory cell array 11-2. The operation will be explained by taking the process of writing data in the memory unit BLU<0> included in the memory cell array 11-1 as an example.

First, the column decoder (not shown) turns on the column gate 13-1 connected to the bit line BLR0, thereby connecting the memory unit BLU<0> to the common line CL-1. Also, the column decoder (not shown) turns on the column gate 14-1 connected to the bit line BLL0, thereby connecting the memory unit BLU<0> to the common line bCL-1. The row decoder 12-1 activates the word line WL connected to the memory cell MC as a write target.

In this state, one of the terminals D_L and bD_L is set at a positive write voltage Vw and the other is set at the ground voltage VSS (0 V) in accordance with the data to be written. Consequently, the drivers 15-1 and 16-1 supply a write current to the memory cell MC as a write target, thereby executing the write operation.

(Effects)

In the first embodiment as has been described in detail above, each memory unit BLU has the reference current generator 30 for generating the reference current Iref to be used in the sense operation of the sense amplifier SA. The reference current generator 30 generates the reference current Iref middle between the read current I0 of a memory cell storing data "0" and the read current I1 of a memory cell storing data "1". To generate the reference current Iref meeting the condition, the reference current generator 30 is configured to have middle admittance Ymid=(Rmax+Rmin)/2Rmax*Rmin by using the resistance elements Rmax and Rmin.

In the first embodiment, therefore, the read margin can be increased for both the read currents I0 and I1. This makes it possible to reduce read errors of the MRAM.

Also, the MTJ element having the same structure as that of the memory cell MC is used as the resistance element forming the reference current generator 30. A "0" write current flows through the resistance element having the resistance value Rmin, i.e., the resistance element storing data "0". A "1" write current flows through the resistance element having the resistance value Rmax, i.e., the resistance element storing data "1".

In a read operation, therefore, it is possible to prevent the magnetization arrangements in the resistance elements forming the reference current generator 30 from reversing owing to the influence of a read disturbance. As a consequence, the reference current Iref having high accuracy and high stability can be generated.

Furthermore, all the memory units BLU each including the reference current generator 30 have the same configuration. This decreases the imbalance of the bit line capacitance between a bit line for the reference current Iref and a bit line for data read during a read operation. This makes it possible to reduce read errors.

(Second Embodiment)

In the second embodiment, an MRAM is formed by using a so-called double-gate type memory cell in which two selection transistors are connected to one MTJ element. In this double-gate type memory cell, the two selection transistors are used to supply a write current to one MTJ element, so a large write current can be supplied to the MTJ element. Note that the idea of generating a reference current Iref middle between read currents I0 and I1 is the same as that of the first embodiment.

Figure 7:
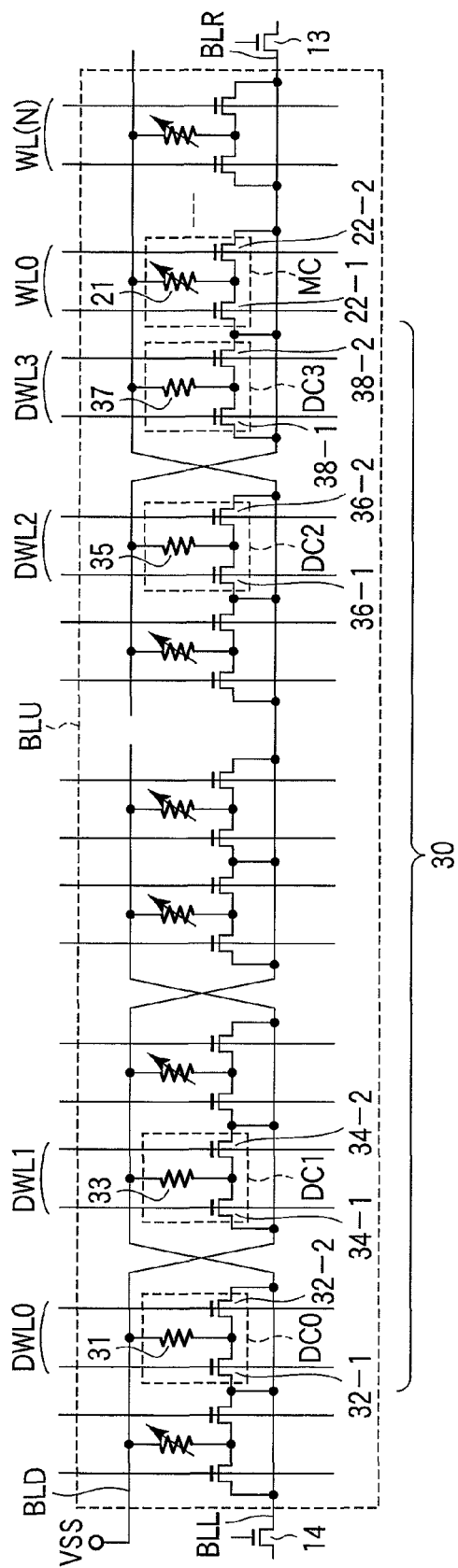
FIG. 7 is a circuit diagram showing the arrangement of a memory unit BLU according to the second embodiment.

FIG. 7 is a circuit diagram showing the arrangement of one memory unit BLU according to the second embodiment. Note that the arrangement is the same as that shown in FIG. 1 except for the memory unit. The memory unit BLU includes bit lines BLR, BLL, and BLD. The bit line BLD is grounded.

The memory unit BLU includes (N+1) memory cells MC. Each memory cell MC includes an MTJ element 21 as a variable resistance element, and two selection transistors 22-1 and 22-2. The arrangement of the MTJ element 21 is the same as that shown in FIG. 3. Each selection transistor 22 is, e.g., an N-channel MOSFET. The MTJ element 21 has one terminal connected to the bit line BLL, and the other terminal connected to one end of the current path of each of the selection transistors 22-1 and 22-2. The other end of the current path of each of the selection transistors 22-1 and 22-2 is connected to the bit line BLR. The gates of the selection transistors 22-1 and 22-2 are connected to a pair of word lines WL. As the pair of word lines WL are activated at the same timing, the selection transistors 22-1 and 22-2 are turned on at the same timing.

The memory unit BLU includes a reference current generator 30 for generating the reference current Iref to be used by a sense amplifier SA in a read operation. The reference current generator 30 includes four dummy cells DC0 to DC3. The dummy cells DC0 to DC3 form a middle admittance generator shown in FIG. 5. The dummy cells DC0 to DC3 each have the same structure as that of the memory cell MC.

An MTJ element (resistance element) 31 included in the dummy cell DC0 has one terminal connected to the bit line BLD, and the other terminal connected to one end of the current path of each of selection transistors 32-1 and 32-2. The other end of the current path of each of the selection transistors 32-1 and 32-2 is connected to the bit line BLL, and the gates of the selection transistors 32-1 and 32-2 are connected to a pair of dummy word lines DWL0. The MTJ element 31 is set at a resistance value Rmax.

An MTJ element (resistance element) 33 included in the dummy cell DC1 has one terminal connected to the bit line BLL, and the other terminal connected to one end of the current path of each of selection transistors 34-1 and 34-2. The other end of the current path of each of the selection transistors 34-1 and 34-2 is connected to the bit line BLD, and the gates of the selection transistors 34-1 and 34-2 are connected to a pair of dummy word lines DWL1. The MTJ element 33 is set at a resistance value Rmin.

An MTJ element (resistance element) 35 included in the dummy cell DC2 has one terminal connected to the bit line BLR, and the other terminal connected to one end of the current path of each of selection transistors 36-1 and 36-2. The other end of the current path of each of the selection transistors 36-1 and 36-2 is connected to the bit line BLL, and the gates of the selection transistors 36-1 and 36-2 are connected to a pair of dummy word lines DWL2. The MTJ element 35 is set at the resistance value Rmin.

An MTJ element (resistance element) 37 included in the dummy cell DC3 has one terminal connected to the bit line BLL, and the other terminal connected to one end of the current path of each of selection transistors 38-1 and 38-2. The other end of the current path of each of the selection transistors 38-1 and 38-2 is connected to the bit line BLR, and the gates of the selection transistors 38-1 and 38-2 are connected to a pair of dummy word lines DWL3. The MTJ element 37 is set at the resistance value Rmax.

Since the dummy cells DC0 to DC3 form the middle admittance generator shown in FIG. 5, the pair of bit lines BLL and BLD are twisted in a specific position, and the pair of bit lines BLR and BLL are twisted in a specific position. More specifically, the bit lines of either pair need only be crossed between adjacent dummy cells DC. The pair of bit lines BLL and BLD are crossed once between the dummy cells DC0 and DC1, and further crossed once between the dummy cells DC1 and DC2. The pair of bit lines BLR and BLL are crossed once between the dummy cells DC2 and DC3.

Figure 8:
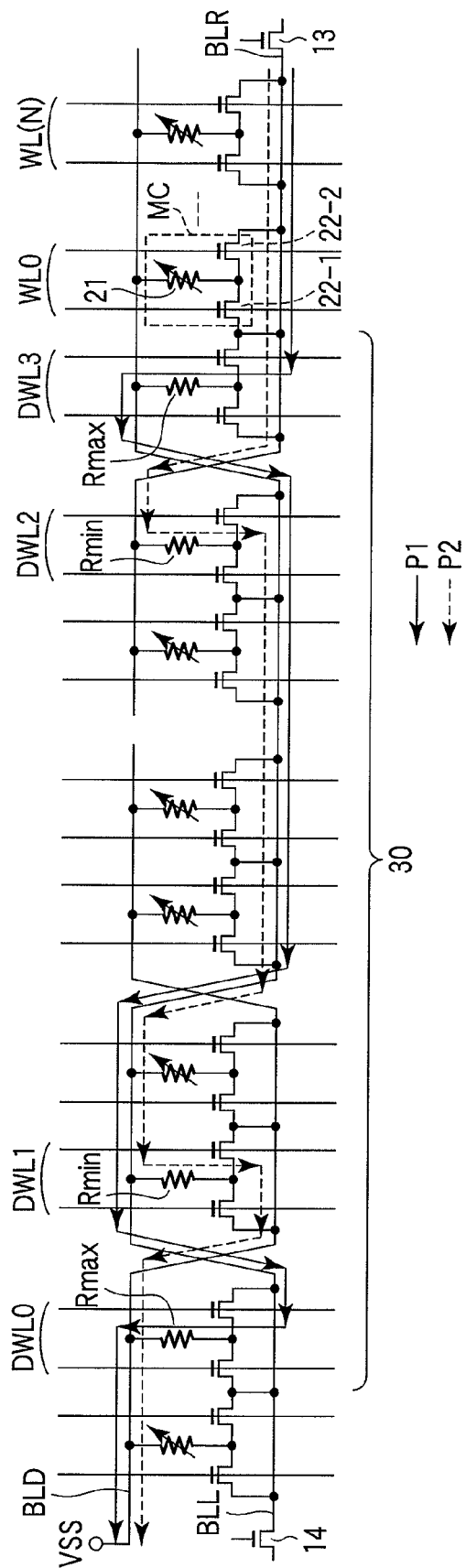
FIG. 8 is a circuit diagram showing the current paths of a reference current generator 30.

FIG. 8 is a circuit diagram showing the current paths of the reference current generator 30. A first current path P1 runs through the bit line BLR, the resistance element Rmax of the dummy cell DC3, the bit line BLL, the resistance element Rmax of the dummy cell DC0, and the bit line BLD. A second current path P2 runs through the bit line BLR, the resistance element Rmin of the dummy cell DC2, the bit line BLL, the resistance element Rmin of the dummy cell DC1, and the bit line BLD. That is, the reference current generator 30 forms the middle admittance circuit shown in FIG. 5 by the first current path P1 and second current path P2. In a read operation, therefore, the reference current generator 30 generates the reference current Iref middle between the read current I0 of a "0" cell and the read current I1 of a "1" cell.

As described previously, the dummy cells DC0 to DC3 of this embodiment have the same structure as that of the memory cell MC, i.e., the dummy cells DC0 to DC3 have the structure shown in FIG. 3. When the current paths shown in FIG. 8 are implemented, a current in the same direction as that of a "0" write current flows through the MTJ elements 33 and 35 having the resistance value Rmin, i.e., the MTJ elements 33 and 35 storing data "0". Also, a current in the same direction as that of a "1" write current flows through the MTJ elements 31 and 37 having the resistance value Rmax, i.e., the MTJ elements 31 and 37 storing data "1".

In the reference current generator 30 of this embodiment, therefore, it is possible to prevent the magnetization arrangements in the MTJ elements 31, 33, 35, and 37 included in the dummy cells DC0 to DC3 from reversing owing to the influence of a read disturbance during a read operation.

In the second embodiment as has been described in detail above, the read margin can be increased for both the read currents I0 and I1. This makes it possible to reduce read errors. The rest of the effects are the same as those of the first embodiment.

EXAMPLES

As described earlier, various memories other than the MRAM can be used as the resistance-change memory. An ReRAM and PCRAM will be explained below as other examples of the resistance-change memory.

Figure 9:
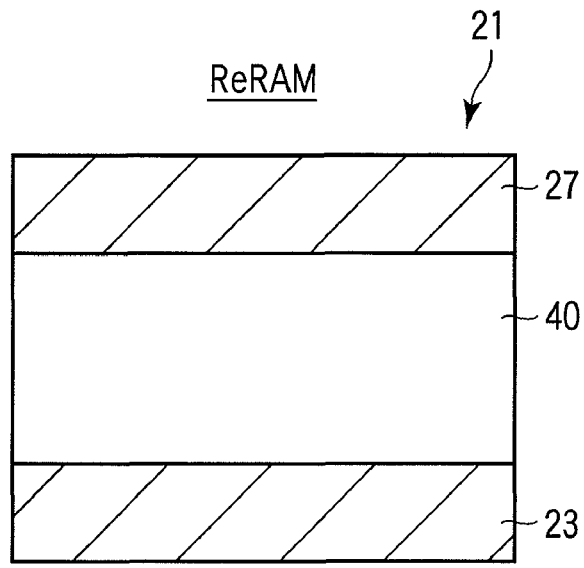
FIG. 9 is a schematic view showing the arrangement of a variable resistance element 21 for use in a ReRAM.

FIG. 9 is a schematic view showing the arrangement of a variable resistance element 21 for use in the ReRAM. The variable resistance element 21 includes a lower electrode 23, an upper electrode 27, and a recording layer 40 sandwiched between them.

The recording layer 40 is made of a perovskite metal oxide, or a transition metal oxide such as a binary metal oxide. Examples of the perovskite metal oxide are PCMO ($Pr_{0.7}Ca_{0.3}MnO_3$), Nb-added $SrTi(Zr)O_3$, and Cr-added $SrTi(Zr)O_3$. Examples of the binary metal oxide are NiO, $TiO_2$, and $Cu_2O$.

The resistance value of the variable resistance element 21 changes when the polarity of a voltage to be applied to the element is changed (a bipolar type), or when the absolute value of the voltage to be applied to the element is changed (a unipolar type). Accordingly, the variable resistance element 21 is set in the low-resistance state or high-resistance state by controlling the application voltage. Note that whether the variable resistance element 21 is a bipolar element or unipolar element depends on a material selected as the recording layer 40.

Assuming that the variable resistance element 21 is a bipolar element, that a voltage for changing the variable resistance element 21 from the high-resistance state (a reset state) to the low-resistance state (a set state) is a set voltage Vset, and that a voltage for changing the variable resistance element 21 from the low-resistance state (set state) to the high-resistance state (reset state) is Vreset, the set voltage Vset is set at a positive bias that applies a positive voltage to the upper electrode 27 with respect to the lower electrode 23, and the reset voltage Vreset is set at a negative bias that applies a negative voltage to the upper electrode 27 with respect to the lower electrode 23. The variable resistance element 21 can store 1-bit data by making the low-resistance state and high-resistance state correspond to data "0" and data "1", respectively.

Data read is performed by applying a very low read voltage about 1/1000 to 1/4 the reset voltage Vreset. Data can be read by detecting a current flowing through the variable resistance element 21 in this state.

Figure 10:
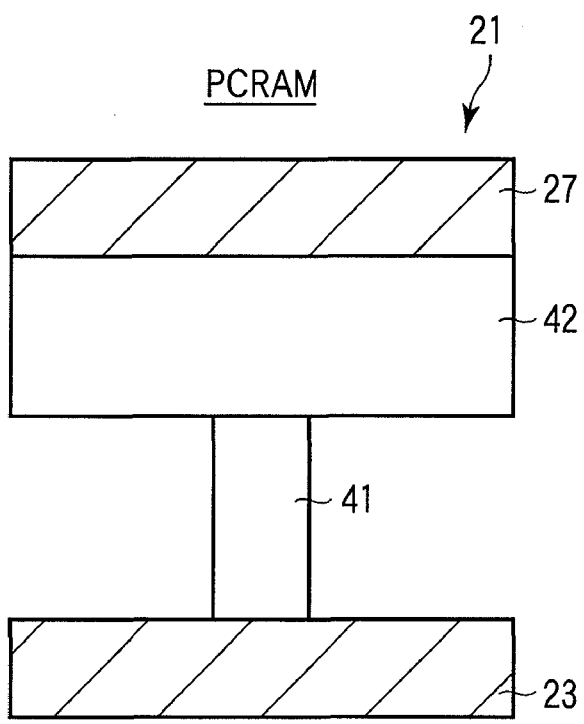
FIG. 10 is a schematic view showing the arrangement of a variable resistance element 21 for use in a PCRAM.

FIG. 10 is a schematic view showing the arrangement of a variable resistance element 21 for use in the PCRAM. The variable resistance element 21 is formed by sequentially stacking a lower electrode 23, heater layer 41, recording layer 42, and upper electrode 27.

The recording layer 42 is made of a phase-change material, and set in a crystalline state or amorphous state by heat generated during a write operation. Examples of the material of the recording layer 42 are chalcogen compounds such as Ge—Sb—Te, In—Sb—Te, Ag—In—Sb—Te, and Ge—Sn—Te. These materials are desirable to ensure high-speed switching characteristics, high repetitive recording stability, and high reliability.

The heater layer 41 is in contact with the bottom surface of the recording layer 42. The area by which the heater layer 41 is in contact with the recording layer 42 is desirably smaller than the area of the bottom surface of the recording layer 42, in order to decrease a portion to be heated by decreasing the contact portion between the heater layer 41 and recording layer 42, thereby reducing a write current or voltage. The heater layer 41 is made of a conductive material, and desirably made of a material selected from, e.g., TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W, and Cu. The heater layer 41 may also be made of the same material as that of the lower electrode 23 described below.

The area of the lower electrode 23 is larger than that of the heater layer 41. The upper electrode 27 is, e.g., the same as the planar shape of the recording layer 42. Examples of the material of the lower electrode 23 and upper electrode 27 are refractory metals such as Ta, Mo, and W.

When the magnitude and width of a current pulse to be applied to the recording layer 42 are controlled, the heating temperature of the recording layer 42 changes, and the recording layer 42 changes to the crystalline state or amorphous state. More specifically, when writing data, a voltage or current is applied between the lower electrode 23 and upper electrode 27 to supply a current from the upper electrode 27 to the lower electrode 23 via the recording layer 42 and heater layer 41. When the recording layer 42 is heated to nearly the melting point, the recording layer 42 changes to an amorphous phase (high-resistance phase), and maintains the amorphous state even when the application of the voltage or current is stopped.

On the other hand, when the recording layer 42 is heated to nearly a temperature suited for its crystallization by applying a voltage or current between the lower electrode 23 and upper electrode 27, the recording layer 42 changes to a crystalline phase (low-resistance phase), and maintains the crystalline state even when the application of the voltage or current is stopped. To change the recording layer 42 to the crystalline state, the magnitude of a current pulse to be applied to the recording layer 42 is decreased, and the width of the current pulse is increased, compared to those of a current pulse applied when changing the recording layer 42 to the amorphous state. The resistance value of the recording layer 42 can be changed by thus heating the recording layer 42 by applying a voltage or current between the lower electrode 23 and upper electrode 27.

Whether the recording layer 42 is the crystalline phase or amorphous phase can be discriminated by applying, between the lower electrode 23 and upper electrode 27, a low voltage or low current by which the recording layer 42 neither crystallizes nor amorphousizes, and reading the voltage or current between the lower electrode 23 and upper electrode 27. This makes it possible to read 1-bit data from the variable resistance element 21 by making the low-resistance state and high-resistance state correspond to data "0" and data "1", respectively.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a variable resistance element configured to store a first data and a second data in accordance with a change in resistance value;
a current generator configured to generate a reference current for determining data of the variable resistance element, and having a middle admittance between an admittance of the variable resistance element storing the first data and an admittance of the variable resistance element storing the second data; and
a sense amplifier comprising a first input terminal connected to the variable resistance element and a second input terminal connected to the current generator, and configured to compare currents of the first input terminal and the second input terminal,
wherein the middle admittance Ymid satisfies the following equation $Y\text{mid} = (R\text{max} + R\text{min})/(2R\text{max}*R\text{min})$ where Rmin is a resistance value of the variable resistance element storing the first data, and Rmax is a resistance value of the variable resistance element storing the second data.

2. The device of claim 1, wherein the current generator comprises resistance elements having the same structure as a structure of the variable resistance element.

3. The device of claim 1, wherein the current generator comprises:
a first bit line, a second bit line, and a third bit line;
a first current path comprising a first resistance element connected between the first bit line and the second bit line, and a second resistance element connected between the second bit line and the third bit line; and
a second current path comprising a third resistance element connected between the first bit line and the second bit line, and a fourth resistance element connected between the second bit line and the third bit line,
the first resistance element and the second resistance element have the same resistance value as a resistance value of the variable resistance element storing the first data, and the third resistance element and the fourth resistance element have the same resistance value as a resistance value of the variable resistance element storing the second data.

4. The device of claim 3, wherein
the first bit line is connected to the second input terminal of the sense amplifier, and
the third bit line is grounded.

5. The device of claim 3, wherein a variable resistance element as a memory element is connected between the first bit line and the second bit line.

6. The device of claim 3, wherein
the first resistance element and the second resistance element are configured to supply a current in a direction to write the first data in a read operation, and
the third resistance element and the fourth resistance element are configured to supply a current in a direction to write the second data in the read operation.

7. The device of claim 3, further comprising:
a first selection transistor connected to a first terminal of the first resistance element;
a second selection transistor connected to a first terminal of the second resistance element;
a third selection transistor connected to a first terminal of the third resistance element;
a fourth selection transistor connected to a first terminal of the fourth resistance element;
a first dummy word line connected to a gate of the first selection transistor;
a second dummy word line connected to a gate of the second selection transistor;
a third dummy word line connected to a gate of the third selection transistor; and
a fourth dummy word line connected to a gate of the fourth selection transistor.

8. The device of claim 7, further comprising a row decoder configured to control the first dummy word line, the second dummy word line, the third dummy word line, and the fourth dummy word line.

9. The device of claim 3, further comprising:
first and second selection transistors connected to a first terminal of the first resistance element;
third and fourth selection transistors connected to a first terminal of the second resistance element;
fifth and sixth selection transistors connected to a first terminal of the third resistance element;
seventh and eighth selection transistors connected to a first terminal of the fourth resistance element;
first and second dummy word lines connected to gates of the first and second selection transistors, respectively;
third and fourth dummy word lines connected to gates of the third and fourth selection transistors, respectively;
fifth and sixth dummy word lines connected to gates of the fifth and sixth selection transistors, respectively; and
seventh and eighth dummy word lines connected to gates of the seventh and eighth selection transistors, respectively.

10. The device of claim 9, further comprising a row decoder configured to control the first to eighth dummy word lines.

11. The device of claim 1, further comprising:
a selection transistor connected to a first terminal of the variable resistance element; and
a word line connected to a gate of the selection transistor.

12. The device of claim 1, further comprising:
first and second selection transistors connected to a first terminal of the variable resistance element; and
first and second word lines connected to gates of the first and second selection transistors, respectively.

13. The device of claim 1, wherein the variable resistance element comprises a fixed layer comprising a fixed magnetization direction, a recording layer comprising a variable magnetization direction, and a nonmagnetic layer between the fixed layer and the recording layer.

* * * * *